(12) United States Patent
Joshi

(10) Patent No.: US 8,981,577 B2
(45) Date of Patent: Mar. 17, 2015

(54) INTEGRATED CIRCUIT PACKAGING SYSTEM WITH INTERCONNECT AND METHOD OF MANUFACTURE THEREOF

(75) Inventor: Mukul Joshi, Mountain View, CA (US)

(73) Assignee: STATS ChipPAC Ltd., Singapore (SG)

( * ) Notice: Subject to any disclaimer, the term of this patent is extended or adjusted under 35 U.S.C. 154(b) by 820 days.

(21) Appl. No.: 12/731,045

(22) Filed: Mar. 24, 2010

(65) Prior Publication Data

US 2011/0233748 A1 Sep. 29, 2011

(51) Int. Cl.
*H01L 29/40* (2006.01)
*H01L 23/31* (2006.01)
*H01L 21/56* (2006.01)
*H01L 23/498* (2006.01)
*H01L 23/00* (2006.01)

(52) U.S. Cl.
CPC .......... *H01L 23/3128* (2013.01); *H01L 21/563* (2013.01); *H01L 23/49833* (2013.01); *H01L 24/73* (2013.01); *H01L 24/97* (2013.01); *H01L 2224/16227* (2013.01); *H01L 2224/32225* (2013.01); *H01L 2224/48091* (2013.01); *H01L 2224/48227* (2013.01); *H01L 2224/73207* (2013.01); *H01L 2224/73253* (2013.01); *H01L 2224/73265* (2013.01); *H01L 2224/97* (2013.01); *H01L 2924/01082* (2013.01); *H01L 2924/19107* (2013.01); *H01L 24/48* (2013.01); *H01L 2924/01033* (2013.01); *H01L 2924/01076* (2013.01); *H01L 2924/014* (2013.01); *H01L 2924/15311* (2013.01); *H01L 2924/10253* (2013.01); *H01L 2224/16225* (2013.01)

USPC .......... 257/784; 257/777; 257/778; 438/107; 438/108; 438/109

(58) Field of Classification Search
USPC .......................................... 257/784
See application file for complete search history.

(56) References Cited

U.S. PATENT DOCUMENTS

| 7,271,479 | B2 | 9/2007 | Zhao et al. | |
| 7,355,274 | B2 * | 4/2008 | Lim | 257/686 |
| 7,429,786 | B2 | 9/2008 | Karnezos et al. | |
| 7,429,787 | B2 * | 9/2008 | Karnezos et al. | 257/686 |
| 7,435,619 | B2 | 10/2008 | Shim et al. | |
| 2001/0040285 | A1 * | 11/2001 | Ishio et al. | 257/690 |
| 2005/0104196 | A1 | 5/2005 | Kashiwazaki | |
| 2006/0065958 | A1 * | 3/2006 | Tsao et al. | 257/678 |

* cited by examiner

*Primary Examiner* — Mark Tornow
(74) *Attorney, Agent, or Firm* — Ishimaru & Associates LLP

(57) ABSTRACT

A method of manufacture of an integrated circuit packaging system includes: providing an interposer having an interposer first side and an interposer second side opposing the interposer first side; mounting an integrated circuit to the interposer first side, the integrated circuit having a non-active side and an active side with the non-active side facing the interposer; connecting first interconnects between the active side and the interposer first side, the first interconnects having a first density on the interposer first side; mounting the interposer over a package carrier with the interposer first side facing the package carrier; connecting second interconnects between the package carrier and the interposer second side, the second interconnects having a second density on the interposer second side, the second density that is approximately the same as the first density; and forming an encapsulation over the package carrier covering the interposer and the second interconnects.

17 Claims, 6 Drawing Sheets

INTEGRATED CIRCUIT PACKAGING SYSTEM WITH INTERCONNECT AND METHOD OF MANUFACTURE THEREOF

TECHNICAL FIELD

The present invention relates generally to an integrated circuit packaging system, and more particularly to a system for an integrated circuit packaging system with interconnect.

BACKGROUND ART

In the manufacture of electronics, semiconductor products such as integrated circuit ("IC") dies or chips are prepared. These semiconductor products are to be accommodated in a package and need to be electrically connectable to components outside the package. For this purpose, a plurality of semiconductor products is first mounted on lead frames in a die bonding process. Next, each semiconductor product is electrically connected to the associated lead frame in a wire-bonding process before packaging the semiconductor product. In the wirebonding process, bond pads on one or more surfaces of each semiconductor product are electrically and mechanically connected to leads of the associated lead frame by thin metallic wires, using a wirebonding tool.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Different challenges arise from increased functionality integration and miniaturization. For example, many semiconductor (or "chip") packages having increased functionality may be made smaller but may be required to provide a large number of inputs/outputs ("I/Os"), many of which may be connected to reference sources such as digital ground, analog ground, digital supply voltage, analog supply voltage, reference voltage and so forth. Many applications require the reference sources to be electrically isolated to provide electrical performance. Numerous package approaches include mechanical and chemical means to isolate the reference sources.

Thus, a need still remains for an integrated circuit packaging system including high I/O density, low cost, and improved reliability. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing an interposer having an interposer first side and an interposer second side opposing the interposer first side; mounting an integrated circuit to the interposer first side, the integrated circuit having a non-active side and an active side with the non-active side facing the interposer; connecting first interconnects between the active side and the interposer first side, the first interconnects having a first density on the interposer first side; mounting the interposer over a package carrier with the interposer first side facing the package carrier; connecting second interconnects between the package carrier and the interposer second side, the second interconnects having a second density on the interposer second side, the second density that is approximately the same as the first density; and forming an encapsulation over the package carrier covering the interposer and the second interconnects.

The present invention provides an integrated circuit packaging system, including: an interposer having an interposer first side and an interposer second side opposing the interposer first side; an integrated circuit mounted to the interposer first side, the integrated circuit having a non-active side and an active side with the non-active side facing the interposer; first interconnects between the active side and the interposer first side, the first interconnects having a first density on the interposer first side; a package carrier with the interposer thereover, the interposer first side facing the package carrier; second interconnects between the package carrier and the interposer second side, the second interconnects having a second density on the interposer second side, the second density that is approximately the same as the first density; and an encapsulation over the package carrier covering the interposer and the second interconnects.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
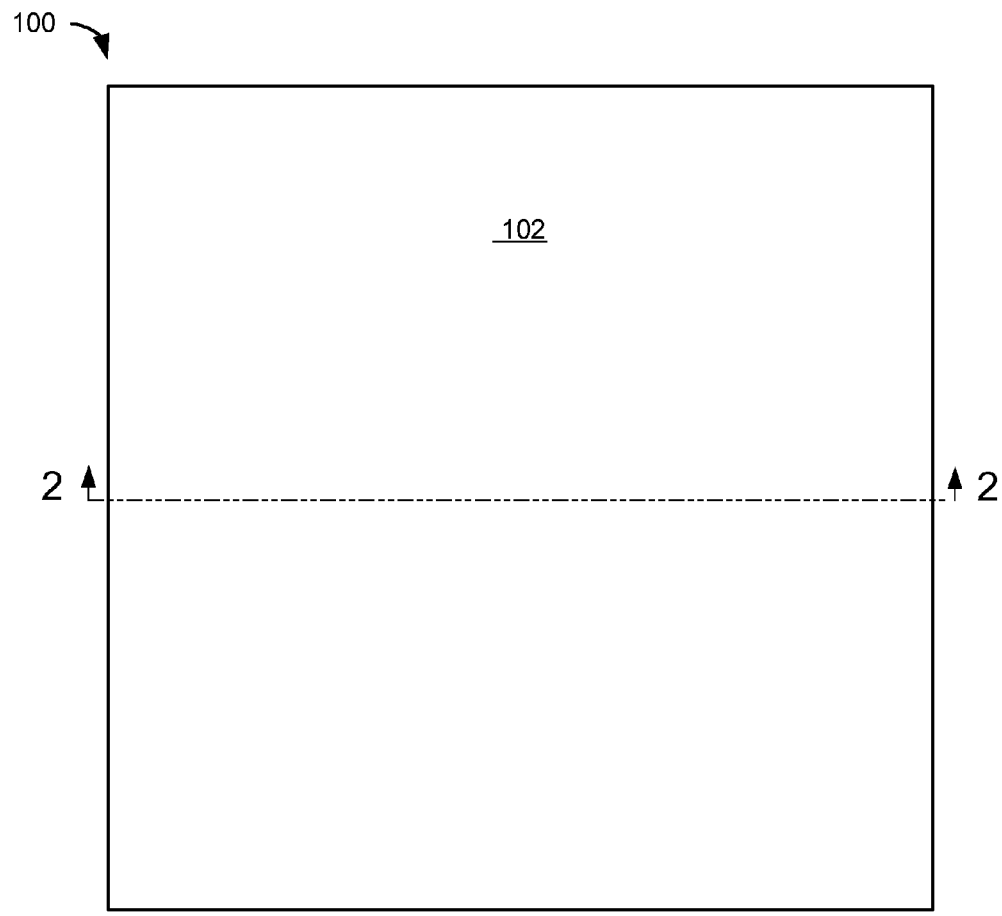
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can be applicable to a high density flip chip (flip chip-HD) package or a flip chip-HD technology. The integrated circuit packaging system 100 can also be applicable to packaging systems, such as molded flip chip, flip chip package-on-package (fcPoP), flip chip fan-in package-on-package (fcFiPoP), or other package systems with different package formats.

The integrated circuit packaging system 100 can include an encapsulation 102, such as a cover including a fine filler mold compound, an encapsulant, an epoxy molding compound, or a molding material.

Figure 2:
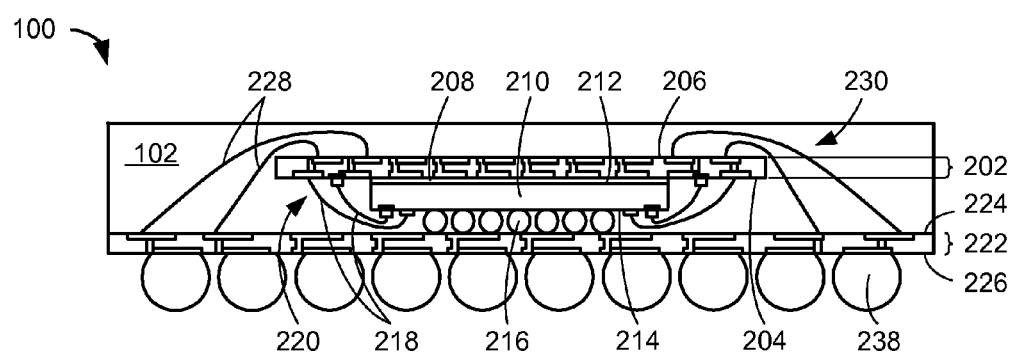
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The integrated circuit packaging system 100 can include an interposer 202, such as an internal stacking module (ISM) or an interface module.

The interposer 202 can include a silicon wafer, a substrate, a through-silicon via (TSV), or any combination thereof. The interposer 202 can include functions for stacking or interconnecting integrated circuit packaging systems. The interposer 202 can have an interposer first side 204 and an interposer second side 206 opposite to the interposer first side 204.

The integrated circuit packaging system 100 can include an attach layer 208, such as a die-attach adhesive, a film, or an epoxy. The integrated circuit packaging system 100 can include an integrated circuit 210, such as a flip chip, a Controlled Collapse Chip Connection (C4), an integrated circuit die, a packaged integrated circuit, or a semiconductor device. For example, the integrated circuit 210 can be a high density flip chip (flip chip-HD), a flip chip-HD die, or a flip chip die.

The integrated circuit 210 can have a non-active side 212 and an active side 214 with the non-active side 212 facing the interposer 202. The active side 214 is defined as a side of the integrated circuit 210 having active circuitry fabricated thereon or having elements for connection to the active circuitry within the integrated circuit 210.

The integrated circuit 210 can be mounted to the interposer first side 204. The attach layer 208 can be attached to the interposer first side 204 and the non-active side 212.

The integrated circuit 210 can include an integrated circuit interconnect 216, such as a bump, a ball, a post, a pillar, or a connector. For example, the integrated circuit interconnect 216 can be formed with solder, a metallic material, an alloy, or a conductive material. Also for example, the integrated circuit interconnect 216 can be a flip chip (FC) bump.

The integrated circuit interconnect 216 can be formed in an array configuration. For example, the integrated circuit interconnect 216 can be formed in a full area array or an area array that is fully populated. The integrated circuit interconnect 216 can face away from the interposer 202.

The integrated circuit 210 can have a die layout with wire bond (WB) pads at peripheral rows of the integrated circuit 210 and a bump array at inner rows of the integrated circuit 210. As such, the integrated circuit 210 can have a combination of wire bond (WB) and flip chip (FC) interconnects on a single chip.

The integrated circuit packaging system 100 can include first interconnects 218, such as bond wires, ribbon bond wires, or conductive wires, attached to the interposer 202 and the integrated circuit 210. The first interconnects 218 can be connected between the interposer first side 204 and the active side 214.

The first interconnects 218 can be adjacent to the integrated circuit interconnect 216. The integrated circuit interconnect 216 can be surrounded by the first interconnects 218.

The first interconnects 218 can have a first density 220 on the interposer first side 204. The first density 220 is defined as a number of the first interconnects 218 per an area or a length of the interposer first side 204 where the area or the length is selected measure the attachments of the first interconnects 218 on the interposer first side 204. A first pitch between the first interconnects 218 can define the inverse of the first density 220.

For example, the area of the interposer first side 204 can be a fixed area of a peripheral region of the interposer 202 at the interposer first side 204. Also for example, the length can be a fixed length along a side of the interposer 202 at the interposer first side 204.

The integrated circuit packaging system 100 can include a package carrier 222, such as a substrate, a leadframe, or a printed circuit board (PCB). The package carrier 222 can include a silicon wafer, a through-silicon via (TSV), or any combination thereof.

The package carrier 222 can have a carrier first side 224 and a carrier second side 226 opposite to the carrier first side 224. The interposer 202 can be mounted over the package carrier 222 with the interposer first side 204 facing the carrier first side 224.

The integrated circuit 210 can be over the package carrier 222 with the active side 214 facing the package carrier 222. The integrated circuit interconnect 216 can be attached on the carrier first side 224.

The integrated circuit packaging system 100 can include second interconnects 228, such as bond wires, ribbon bond wires, or conductive wires, attached to the interposer 202 and the package carrier 222. The second interconnects 228 can be connected between the interposer second side 206 and the carrier first side 224.

The second interconnects 228 can have a second density 230 on the interposer second side 206. The second density 230 is defined as a number of the second interconnects 228 per an area or a length of the interposer second side 206 where the area or the length is selected to measure the attachments of the second interconnects 228 on the interposer second side 206. The area or the length of the interposer first side 204 has to be the same as that of the interposer second side 206 for purposes of calculating the first density 220 and the second density 230, respectively. A second pitch between the second interconnects 228 can define the inverse of the second density 230.

For example, the area of the interposer second side 206 can be a fixed area of a peripheral region of the interposer 202 at the interposer second side 206. Also for example, the length can be a fixed length along a side of the interposer 202 at the interposer second side 206.

The second density 230 is approximately the same as the first density 220 or have the potential to be connected to approximately the same density. This also means the first pitch and the second pitch are approximately the same.

The second density 230 can be at least three times (3×) greater than a density of the integrated circuit interconnect 216. The density of the integrated circuit interconnect 216 is defined as a number of the integrated circuit interconnect 216 per an area or a length of the active side 214 where the integrated circuit interconnect 216 is attached to the active side 214.

For example, the area of the active side 214 can be a fixed area of an interior region of the integrated circuit 210 at the active side 214. Also for example, the length can be a fixed length along a side of the integrated circuit 210 at the active side 214.

The interposer 202 can specifically be used to attach the first interconnects 218 and the second interconnects 228. The integrated circuit interconnect 216, the first interconnects 218, and the second interconnects 228 can provide a high I/O density for connectivity to the package carrier 222. The interposer 202, the integrated circuit 210, the first interconnects 218, and the second interconnects 228 can enable package assembly in different package configurations.

The integrated circuit packaging system 100 can include the encapsulation 102 formed over the package carrier 222. The encapsulation 102 can be formed to cover the interposer 202, the integrated circuit 210, the first interconnects 218, and the second interconnects 228.

The integrated circuit packaging system 100 can include an external interconnect 238, such as a ball, a bump, or a connector. The external interconnect 238 can be formed with solder, an alloy, or a conductive material to provide connectivity to external systems. The external interconnect 238 can be attached to the carrier second side 226.

Figure 3:
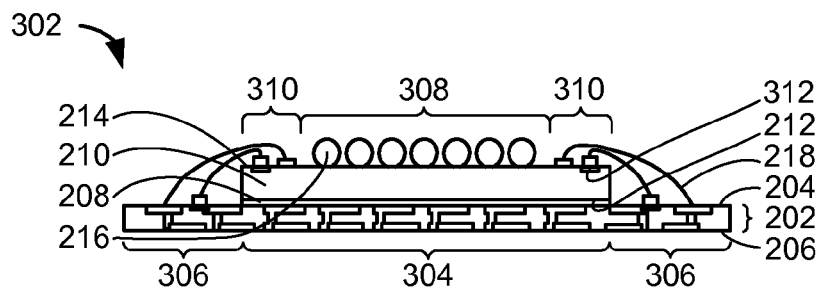
FIG. 3 is a cross-sectional view of a portion of the integrated circuit packaging system of FIG. 2 in a forming phase of a package subassembly.

Referring now to FIG. 3, therein is shown a cross-sectional view of a portion of the integrated circuit packaging system 100 of FIG. 2 in a forming phase of a package subassembly 302. The package subassembly 302 can include the interposer 202 having the interposer first side 204 and the interposer second side 206. The package subassembly 302 can include the integrated circuit 210 attached to the interposer 202 with the attach layer 208.

The package subassembly 302 can include the interposer 202, having an interposer interior region 304 and an interposer peripheral region 306 adjacent to the interposer interior region 304. The interposer peripheral region 306 is defined as a portion of the interposer 202 that is adjacent to a perimeter of the interposer 202. The interposer interior region 304 can be surrounded by the interposer peripheral region 306.

The attach layer 208 can be attached to the interposer 202 and the integrated circuit 210 at the interposer interior region 304. An entirety of the integrated circuit 210 can be mounted at the interposer interior region 304.

The integrated circuit 210 can have the non-active side 212 and the active side 214. The attach layer 208 can be attached to the interposer first side 204 and the non-active side 212.

The integrated circuit 210 can have an integrated circuit interior region 308 and an integrated circuit peripheral region 310 adjacent to the integrated circuit interior region 308. The integrated circuit peripheral region 310 is defined as a portion of the integrated circuit 210 that is adjacent to a perimeter of the integrated circuit 210. For example, the integrated circuit peripheral region 310 can include a peripheral input/output (I/O) geometrical area.

The integrated circuit interior region 308 can be surrounded by the integrated circuit peripheral region 310. The integrated circuit interconnect 216 can be formed at the active side 214. The integrated circuit interconnect 216 can be formed at the integrated circuit interior region 308.

The integrated circuit interconnect 216 can have a bump pitch, defined as a distance between a center of the integrated circuit interconnect 216 to a center of another of the integrated circuit interconnect 216 that is adjacent to and closest to the integrated circuit interconnect 216. For example, the bump pitch can approximately be 100 micrometers.

The integrated circuit interconnect 216 can be attached on the active side 214. With the integrated circuit interconnect 216 formed in an area array to provide bump connections at the integrated circuit interior region 308, the integrated circuit 210 can provide benefits of a flip chip (FC) technology with high I/O counts.

The integrated circuit 210 can have an integrated circuit pad 312, such as a wire bond (WB) pad, a terminal, a lead, or a contact. For example, the integrated circuit pad 312 can be a peripheral WB pad.

The integrated circuit pad 312 can be formed at the active side 214. The integrated circuit pad 312 can be formed at the integrated circuit peripheral region 310.

The integrated circuit pad 312 can have a pad pitch, defined as a distance between a center of the integrated circuit pad 312 to a center of another of the integrated circuit pad 312 that is adjacent to and closest to the integrated circuit pad 312. The integrated circuit pad 312 at the integrated circuit peripheral region 310 can provide a tighter pitch than the bump pitch of the integrated circuit interconnect 216. With the tighter pitch, the integrated circuit pad 312 can enable much higher I/O density in the integrated circuit 210.

The pad pitch can be very fine. For example, the pad pitch can approximately be 30 micrometers to 40 micrometers at the integrated circuit peripheral region 310. Also for example, the pad pitch can approximately be 3 to 4 times tighter or smaller than the bump pitch, allowing much higher I/O density than that of the integrated circuit interconnect 216.

The package subassembly 302 can include the first interconnects 218 connected to the integrated circuit pad 312 at the integrated circuit peripheral region 310. The first interconnects 218 can be connected to the interposer first side 204 at the interposer peripheral region 306.

The integrated circuit pad 312 can provide benefits of high density wire bond pads. With the integrated circuit interconnect 216 at the integrated circuit interior region 308 and the integrated circuit pad 312 at the integrated circuit peripheral region 310, input/output (I/O) density can be maximized for a given size of the integrated circuit 210.

Figure 4:
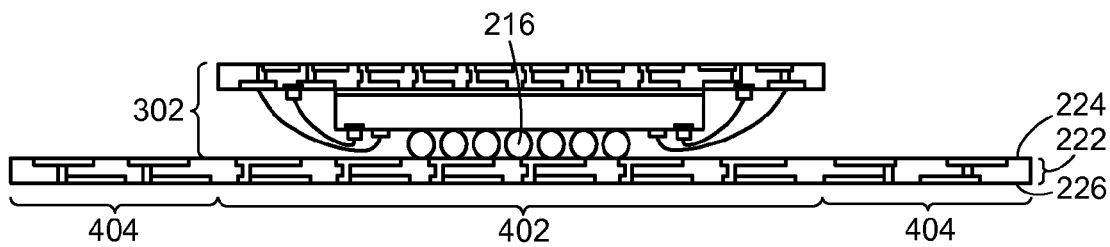
FIG. 4 is the structure of FIG. 3 in a mounting phase of the package subassembly.

Referring now to FIG. 4, therein is shown the structure of FIG. 3 in a mounting phase of the package subassembly 302. The package subassembly 302 can be mounted over the package carrier 222.

The package carrier 222 can have the carrier first side 224 and the carrier second side 226. The package carrier 222 can have a carrier interior region 402 and a carrier peripheral region 404 adjacent to the carrier interior region 402.

The carrier peripheral region 404 is defined as a portion of the package carrier 222 that is adjacent to a perimeter of the package carrier 222. The carrier interior region 402 can be surrounded by the carrier peripheral region 404.

An entirety of the package subassembly 302 can be mounted at the carrier interior region 402. As an example, the package subassembly 302 can be mounted in a manner similar to a flip chip placed upside down and attached to the package carrier 222.

The integrated circuit interconnect 216 can be mounted over the carrier first side 224. The integrated circuit interconnect 216 can be attached at the carrier interior region 402.

The package carrier 222 can have carrier pads, such as C4 pads, connectors, or terminals, formed on the carrier first side 224 and attached to the integrated circuit interconnect 216. The integrated circuit interconnect 216 can be attached to the package carrier 222 with ultrasonic or any reflow processes.

Figure 5:
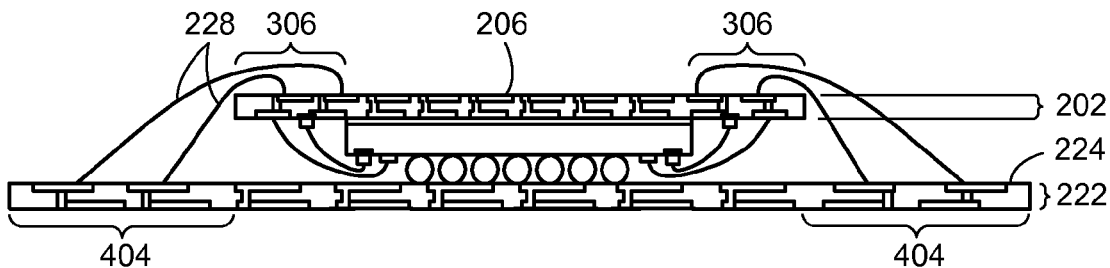
FIG. 5 is the structure of FIG. 4 in a forming phase of the second interconnects.

Referring now to FIG. 5, therein is shown the structure of FIG. 4 in a forming phase of the second interconnects 228. The second interconnects 228 can be attached to the interposer 202 and the package carrier 222.

The second interconnects 228 can be connected to the interposer second side 206 at the interposer peripheral region 306. The second interconnects 228 can be connected to the carrier first side 224 at the carrier peripheral region 404.

Figure 6:
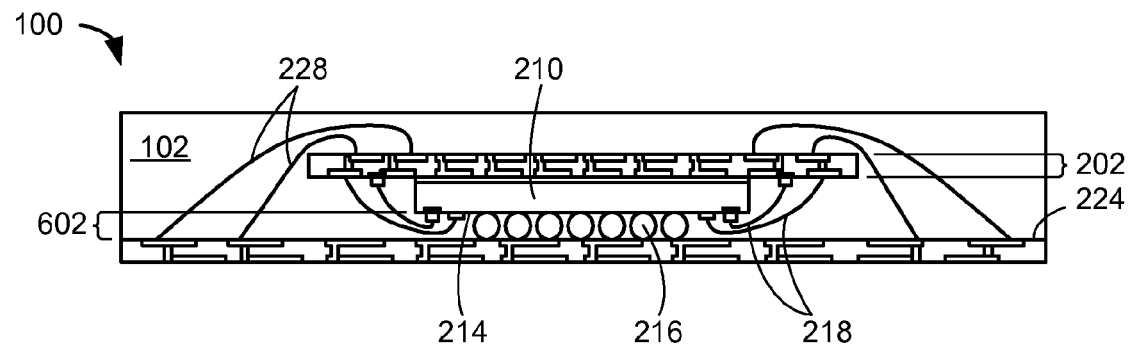
FIG. 6 is the structure of FIG. 5 in a molding phase of the encapsulation.

Referring now to FIG. 6, therein is shown the structure of FIG. 5 in a molding phase of the encapsulation 102. The encapsulation 102 can be formed over the carrier first side 224 covering the interposer 202, the integrated circuit 210, the first interconnects 218, and the second interconnects 228.

The encapsulation 102 can be formed to fill an interposer-carrier region 602, which is defined as a gap or a space between the active side 214 and the carrier first side 224. The interposer-carrier region 602 can be under the integrated circuit 210. Besides functioning as a top cover of the integrated circuit packaging system 100, the encapsulation 102 filled in the interposer-carrier region 602 can function as a mold underfill to protect the integrated circuit interconnect 216.

Figure 7:
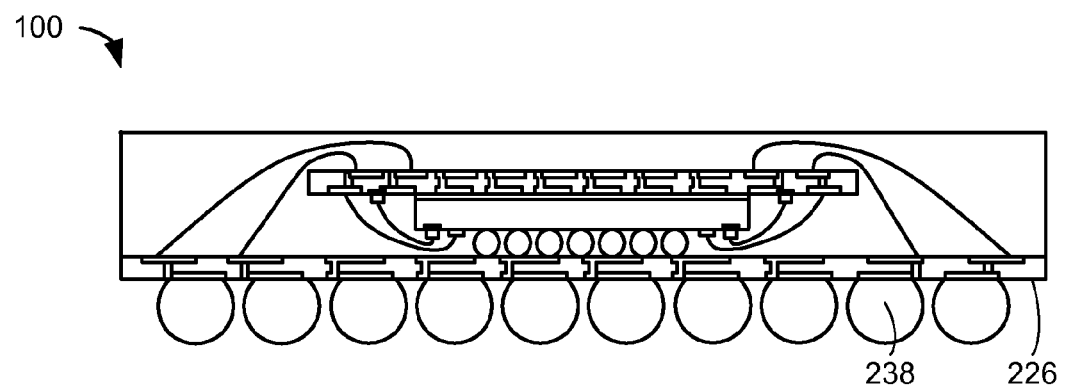
FIG. 7 is the structure of FIG. 6 in a singulation phase of the integrated circuit packaging system.

Referring now to FIG. 7, therein is shown the structure of FIG. 6 in a singulation phase of the integrated circuit packaging system 100. The external interconnect 238 can be attached to the carrier second side 226.

The external interconnect 238 can be formed in an area array. For example, the external interconnect 238 can be formed in a full area array or an area array that is fully populated.

Package singulation steps can be performed to complete a package assembly of the integrated circuit packaging system 100. Singulation can include mechanical or optical means, such as cutting, sawing, laser scribing, or any other singulation processes, to produce individual package units of the integrated circuit packaging system 100.

It has been discovered that the interposer 202, the integrated circuit 210, the first interconnects 218, and the second interconnects 228 provide a higher input/output (I/O) density than standard flip chip fine pitch ball grid array (fcFBGA) packages or today's packaging systems. Standard flip chips (FC) use only bump array interconnects for an entire die area to maximize I/O density but are not as dense as the first density 220 or the second density 230 because interconnects such as those of a wire type have significantly higher density of 3× or more. The limited I/O density problems are also due to wire bonds not capable of having area array interconnects, which are possible only with flip chips. The limited I/O density problems are solved by the present invention. The integrated circuit pad 312 has the pad pitch smaller than the minimum bump pitch. The integrated circuit interconnect 216 is formed in a fully populated area array or at an entire area of the integrated circuit interior region 308 on the active side 214. The integrated circuit pad 312 at the integrated circuit peripheral region 310 and the first interconnects 218 attached thereto as one of interconnect schemes, offers higher I/O density. The present invention provides area array interconnections with the integrated circuit interconnect 216 as another of the interconnect schemes, further offering the higher I/O density benefits. With the interposer 202 and the integrated circuit 210, the first interconnects 218, and the second interconnects 228 attached thereto, the higher I/O density is provided for connecting to both sides of the interposer 202 further increasing the high I/O density. Along a non-horizontal side of the interposer 202, the second interconnects 228 attached to the interposer second side 206 include one of the second interconnects 228 closer to the non-horizontal side than another of the second interconnects 228 to the non-horizontal side.

Figure 8:
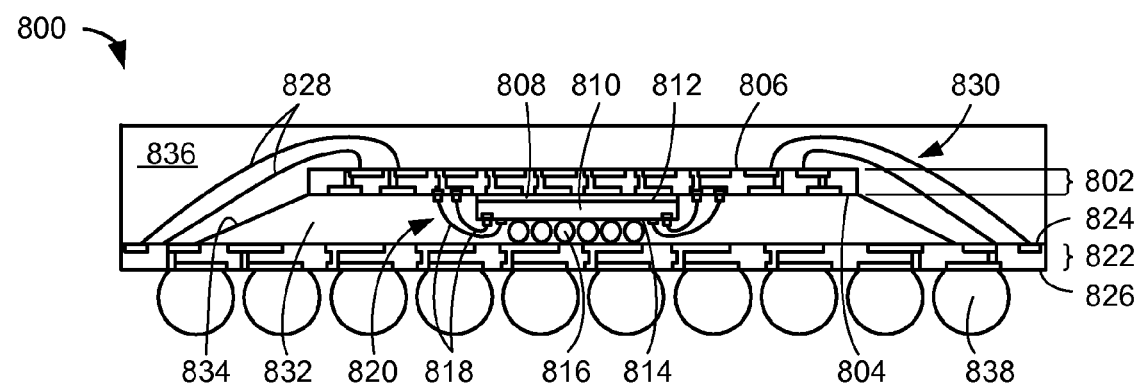
FIG. 8 is a cross-sectional view as exemplified by the top view of FIG. 1 of an integrated circuit packaging system in a second embodiment of the present invention.

Referring now to FIG. 8, therein is shown a cross-sectional view as exemplified by the top view of FIG. 1 of an integrated circuit packaging system 800 in a second embodiment of the present invention. The integrated circuit packaging system 800 can be formed in a manner similar to the integrated circuit packaging system 100 of FIG. 1, except for the formation of the encapsulation 102 of FIG. 1 and an addition layer.

The integrated circuit packaging system 800 can include an interposer 802, having an interposer first side 804 and an interposer second side 806. The integrated circuit packaging system 100 can include an attach layer 808 and an integrated circuit 810, having a non-active side 812, an active side 814, and an integrated circuit interconnect 816. The interposer 802, the attach layer 808, and the integrated circuit 810 can be formed in a manner similar to the interposer 202 of FIG. 2, the attach layer 208 of FIG. 2, and the integrated circuit 210 of FIG. 2, respectively.

The integrated circuit packaging system 800 can include first interconnects 818 having a first density 820. The integrated circuit packaging system 800 can include a package carrier 822 having a carrier first side 824 and a carrier second side 826.

The integrated circuit packaging system 800 can include second interconnects 828 having a second density 830. The first interconnects 818, the package carrier 822, and the second interconnects 828 can be formed in a manner similar to the first interconnects 218 of FIG. 2, the package carrier 222 of FIG. 2, and the second interconnects 228 of FIG. 2, respectively.

Compared to the integrated circuit packaging system 100, the additional layer included in the integrated circuit packaging system 800 can be an underfill 832, such as a capillary underfill, an epoxy resin, or any underfill resin material. The underfill 832 can be dispensed in a space between the interposer 802 and the package carrier 822.

The underfill 832 can cover the attach layer 808, the integrated circuit 810, and the first interconnects 818. The underfill 832 can protect the integrated circuit interconnect 816 and the first interconnects 818.

The underfill 832 can be adjacent to the second interconnects 828. The underfill 832 can be surrounded by the second interconnects 828. The underfill 832 can have a peripheral surface 834 between the interposer first side 804 and the carrier first side 824.

For illustrative purposes, the peripheral surface 834 is shown as taper, although the peripheral surface 834 can be formed differently. For example, the peripheral surface 834 can be vertically formed between the interposer first side 804 and the carrier first side 824.

The integrated circuit packaging system 800 can include an encapsulation 836, such as a cover including a fine filler mold compound, an encapsulant, an epoxy molding compound, or a molding material. The encapsulation 836 can be molded over a portion of the package carrier 822. The encapsulation 836 can be over-molded covering the interposer 802, the second interconnects 828, and the underfill 832.

The integrated circuit packaging system 100 can include an external interconnect 838, such as a ball, a bump, or a connector. The external interconnect 838 can be formed with solder, an alloy, or a conductive material to provide connectivity to external systems. The external interconnect 838 can be attached to the carrier second side 826.

It has been discovered that the underfill 832 significantly improves reliability. The underfill 832 protects not only the integrated circuit interconnect 816 but also the first interconnects 818 in a space entirely below the interposer first side 804, thereby significantly improving the reliability.

Figure 9:
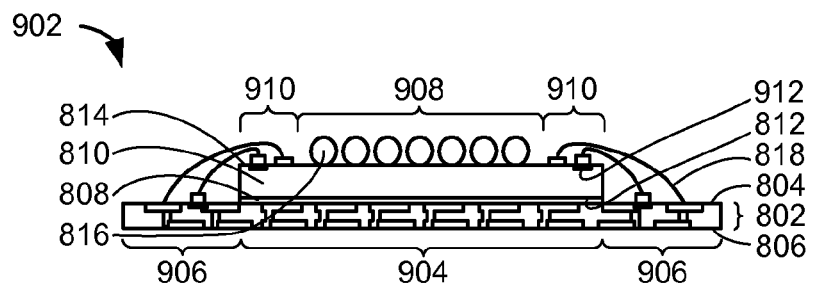
FIG. 9 is a cross-sectional view of a portion of the integrated circuit packaging system of FIG. 8 in a forming phase of a package subassembly.

Referring now to FIG. 9, therein is shown a cross-sectional view of a portion of the integrated circuit packaging system 800 of FIG. 8 in a forming phase of a package subassembly 902. The package subassembly 902 can include the interposer 802 having the interposer first side 804, the interposer second side 806, an interposer interior region 904, and an interposer peripheral region 906.

The package subassembly 902 can include the attach layer 808. The package subassembly 902 can include the integrated circuit 810 having the non-active side 812, the active side 814, the integrated circuit interconnect 816, an integrated circuit interior region 908, an integrated circuit peripheral region 910, and an integrated circuit pad 912.

The package subassembly 902 can include the first interconnects 818. The package subassembly 902 can be formed in a manner similar to the package subassembly 302 of FIG. 3.

Figure 10:
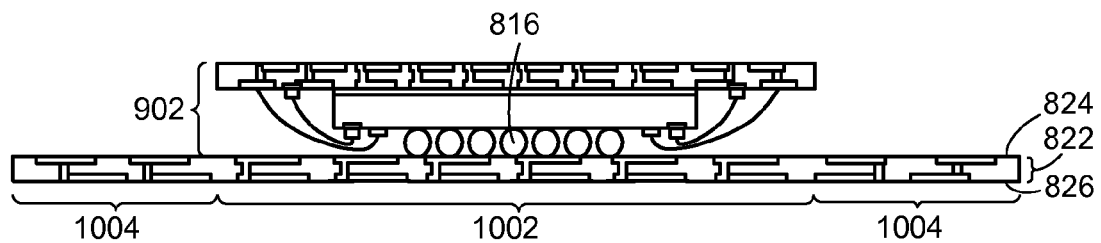
FIG. 10 is the structure of FIG. 9 in a mounting phase of the package subassembly.

Referring now to FIG. 10, therein is shown the structure of FIG. 9 in a mounting phase of the package subassembly 902. The package subassembly 902 can have the integrated circuit interconnect 816. The package carrier 822 can have the carrier first side 824, the carrier second side 826, a carrier interior region 1002, and a carrier peripheral region 1004.

The package carrier 822 can be formed in a manner similar to the package carrier 222 of FIG. 4. The package subassembly 902 can be mounted in a manner similar to the package subassembly 302 of FIG. 4.

Figure 11:
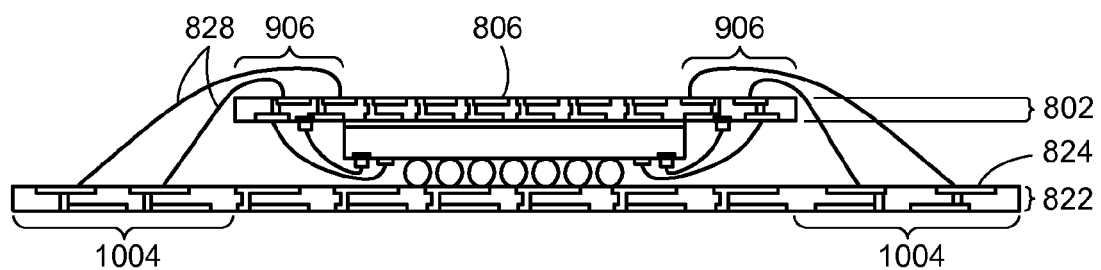
FIG. 11 is the structure of FIG. 10 in a forming phase of the second interconnects.

Referring now to FIG. 11, therein is shown the structure of FIG. 10 in a forming phase of the second interconnects 828. The interposer 802 can have the interposer second side 806 and the interposer peripheral region 906.

The package carrier 822 can have the carrier first side 824 and the carrier peripheral region 1004. The second interconnects 828 can be formed in a manner similar to the second interconnects 228 of FIG. 5.

Figure 12:
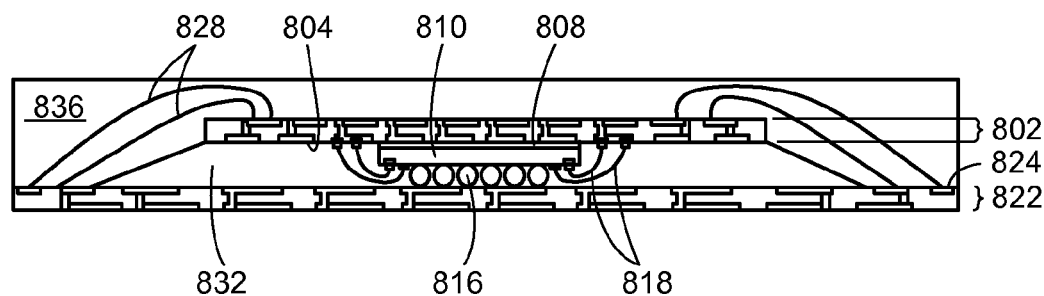
FIG. 12 is the structure of FIG. 11 in a molding phase of the encapsulation.

Referring now to FIG. 12, therein is shown the structure of FIG. 11 in a molding phase of the encapsulation 836. The underfill 832 can be dispensed in a space between the interposer 802 and the package carrier 822 covering the attach layer 808, the integrated circuit 810 having the integrated circuit interconnect 816, and the first interconnects 818.

The underfill 832 can be formed between the interposer first side 804 and the carrier first side 824. The underfill 832 can be entirely formed on the interposer first side 804 and partially formed on the carrier first side 824.

The encapsulation 836 can be molded over a portion of the package carrier 822. The encapsulation 836 can be formed to cover the interposer 802, the second interconnects 828, and the underfill 832.

Figure 13:
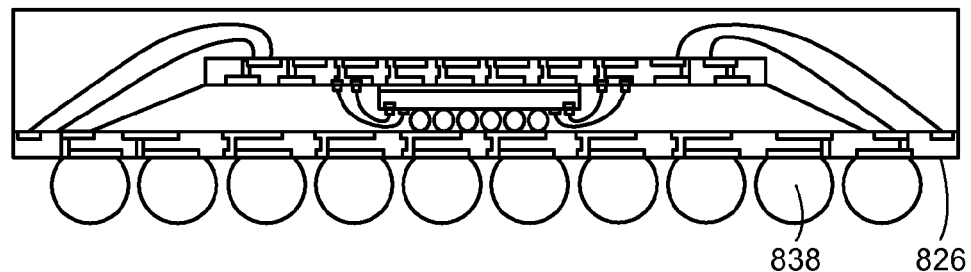
FIG. 13 is the structure of FIG. 12 in a singulation phase of the integrated circuit packaging system.

Referring now to FIG. 13, therein is shown the structure of FIG. 12 in a singulation phase of the integrated circuit packaging system 800. The external interconnect 838 can be attached to the carrier second side 826.

Package singulation steps can be performed to complete a package assembly of the integrated circuit packaging system 800. Singulation can include mechanical or optical means, such as cutting, sawing, laser scribing, or any other singulation processes, to produce individual package units of the integrated circuit packaging system 800.

Figure 14:
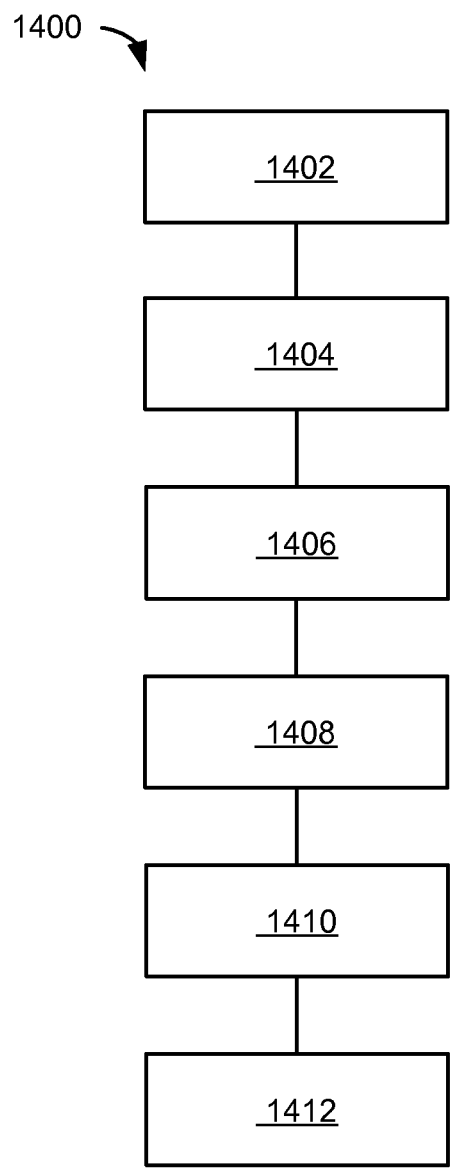
FIG. 14 is a flow chart of a method of manufacture of an integrated circuit packaging system in a further embodiment of the present invention.

Referring now to FIG. 14, therein is shown a flow chart of a method 1400 of manufacture of an integrated circuit packaging system in a further embodiment of the present invention. The method 1400 includes: providing an interposer having an interposer first side and an interposer second side opposing the interposer first side in a block 1402; mounting an integrated circuit to the interposer first side, the integrated circuit having a non-active side and an active side with the non-active side facing the interposer in a block 1404; connecting first interconnects between the active side and the interposer first side, the first interconnects having a first density on the interposer first side in a block 1406; mounting the interposer over a package carrier with the interposer first side facing the package carrier in a block 1408; connecting second interconnects between the package carrier and the interposer second side, the second interconnects having a second density on the interposer second side, the second density that is approximately the same as the first density in a block 1410; and forming an encapsulation over the package carrier covering the interposer and the second interconnects in a block 1412.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing an interposer having an interposer first side and an interposer second side opposing the interposer first side;
   mounting an integrated circuit to the interposer first side, the integrated circuit having a non-active side and an active side with the non-active side facing the interposer;
   connecting first interconnects between the active side and the interposer first side, the first interconnects are connected to integrated circuit pads and have a first density on the interposer first side, the integrated circuit pads have a pad pitch;
   mounting the interposer over a package carrier with the interposer first side facing the package carrier;
   connecting second interconnects between the package carrier and the interposer second side, the second interconnects having a second density on the interposer second side, the second density is approximately the same as the first density;
   mounting an integrated circuit interconnect over the package carrier, the integrated circuit interconnect has a bump pitch, the pad pitch is three to four times tighter than the bump pitch, the integrated circuit has a higher input/output (I/O) density than that of the integrated circuit interconnect;
   connecting the integrated circuit interconnect between the active side of the integrated circuit and the package carrier to provide a shorter electrical signal path between the integrated circuit and the package carrier than the first interconnects and the second interconnects; and
   forming an encapsulation over the package carrier covering the interposer and the second interconnects.

2. The method as claimed in claim 1 wherein connecting the first interconnects includes connecting the first interconnects at an interposer peripheral region of the interposer.

3. The method as claimed in claim 1 wherein connecting the second interconnects includes connecting the second interconnects at an interposer peripheral region of the interposer.

4. The method as claimed in claim 1 wherein:
   connecting the integrated circuit interconnect includes connecting the integrated circuit interconnect in an array configuration;
   connecting the first interconnects between the active side and the interposer first side includes connecting the first interconnects to the integrated circuit peripheral region and the interposer first side; and
   connecting the second interconnects having the second density at least three times greater than that of the integrated circuit interconnect.

5. The method as claimed in claim 1 wherein:
   mounting the integrated circuit includes mounting the integrated circuit having an integrated circuit interior region, the integrated circuit interconnect at the integrated circuit interior region; and
   connecting the first interconnects includes connecting the first interconnects adjacent to the integrated circuit interconnect.

6. The method as claimed in claim 1 wherein forming the encapsulation includes forming the encapsulation covering the integrated circuit interconnect and the first interconnects.

7. The method as claimed in claim 1 further comprising forming an underfill covering the integrated circuit interconnect and the first interconnects.

8. The method as claimed in claim 1 wherein mounting the integrated circuit includes mounting a high density flip chip to the interposer first side.

9. An integrated circuit packaging system comprising:
   an interposer having an interposer first side and an interposer second side opposing the interposer first side;
   an integrated circuit mounted to the interposer first side, the integrated circuit having a non-active side and an active side with the non-active side facing the interposer;
   first interconnects between the active side and the interposer first side, the first interconnects are connected to integrated circuit pads and have a first density on the interposer first side, the integrated circuit pads have a pad pitch;
   a package carrier with the interposer thereover, the interposer first side facing the package carrier;
   second interconnects between the package carrier and the interposer second side, the second interconnects having a second density on the interposer second side, the second density is approximately the same as the first density;
   the integrated circuit having an integrated circuit interconnect, the integrated circuit interconnect having a bump pitch disposed between the active side of the integrated circuit and the package carrier, the pad pitch is three to four times tighter than the bump pitch, the integrated circuit has a higher input/output (I/O) density than that of the integrated circuit interconnect, the integrated circuit interconnect is configured to provide a shorter electrical signal path between the integrated circuit and the package carrier than the first interconnects and the second interconnects; and
   an encapsulation over the package carrier covering the interposer and the second interconnects.

10. The system as claimed in claim 9 wherein the first interconnects are at an interposer peripheral region of the interposer.

11. The system as claimed in claim 9 wherein the second interconnects are at an interposer peripheral region of the interposer.

12. The system as claimed in claim 9 wherein:
the integrated circuit has an integrated circuit interconnect facing away from the interposer; and
the package carrier with the interposer thereover includes the integrated circuit interconnect mounted over the package carrier.

13. The system as claimed in claim 9 wherein:
the integrated circuit interconnect is in an array configuration;
the first interconnects between the active side and the interposer first side is connected to the integrated circuit peripheral region and the interposer first side; and
the second interconnects has the second density at least three times greater than that of the integrated circuit interconnect.

14. The system as claimed in claim 9 wherein:
the integrated circuit has an integrated circuit interior region, the integrated circuit interconnect at the integrated circuit interior region; and
the first interconnects are adjacent to the integrated circuit interconnect.

15. The system as claimed in claim 9 wherein the encapsulation covers the integrated circuit interconnect and the first interconnects.

16. The system as claimed in claim 9 further comprising an underfill covering the integrated circuit interconnect and the first interconnects.

17. The system as claimed in claim 9 wherein the integrated circuit is a high density flip chip mounted to the interposer first side.

* * * * *